United States Patent

Harmgardt

[15] 3,699,468

[45] Oct. 17, 1972

[54] REGULATING AMPLIFIER

[72] Inventor: Hans-Lothar George Harmgardt, Oakville, Ontario, Canada

[73] Assignee: Northern Electric Company Limited, Montreal, Quebec, Canada

[22] Filed: Feb. 8, 1971

[21] Appl. No.: 113,194

[52] U.S. Cl. ......................330/29, 330/59, 330/134, 330/136, 330/144

[51] Int. Cl. ..............................................H03g 3/30

[58] Field of Search...........330/29, 59, 144, 134, 136

[56] References Cited

UNITED STATES PATENTS

| | | | |
|---|---|---|---|
| 3,167,722 | 1/1965 | Weller | 330/59 |
| 3,544,902 | 12/1970 | Daniel | 330/59 UX |
| 3,496,452 | 2/1970 | Vollink | 330/59 X |
| 3,202,926 | 8/1965 | Ford et al. | 330/59 |

*Primary Examiner*—Roy Lake
*Assistant Examiner*—James B. Mullins
*Attorney*—Philip T. Erickson

[57] ABSTRACT

A regulated amplifier for supplying coded tone pulses from a communication line to the filters of a multifrequency decoding detector is made using directly coupled semiconductor elements for amplification and control. The gain of the amplifier is controlled by a light sensitive cadmium sulphide input series resistor illuminated by a gallium arsenide light emitting diode driven by the control circuit. An integrating amplifier stage is used to derive a control voltage from the output of the regulated amplifier, which voltage is modified by a temperature dependent reference voltage for compensating the temperature dependence of the light emitting diode. The control voltage is furnished to the stage that drives the light emitting diode through a coupling diode, so that a blocking voltage produced by an unregulated parallel channel of amplification-integration may be applied to the final control stage, to darken the light emitting diode and put the regulated amplifier in its minimum amplification condition when input signals are below the predetermined energy level.

6 Claims, 1 Drawing Figure

PATENTED OCT 17 1972 3,699,468
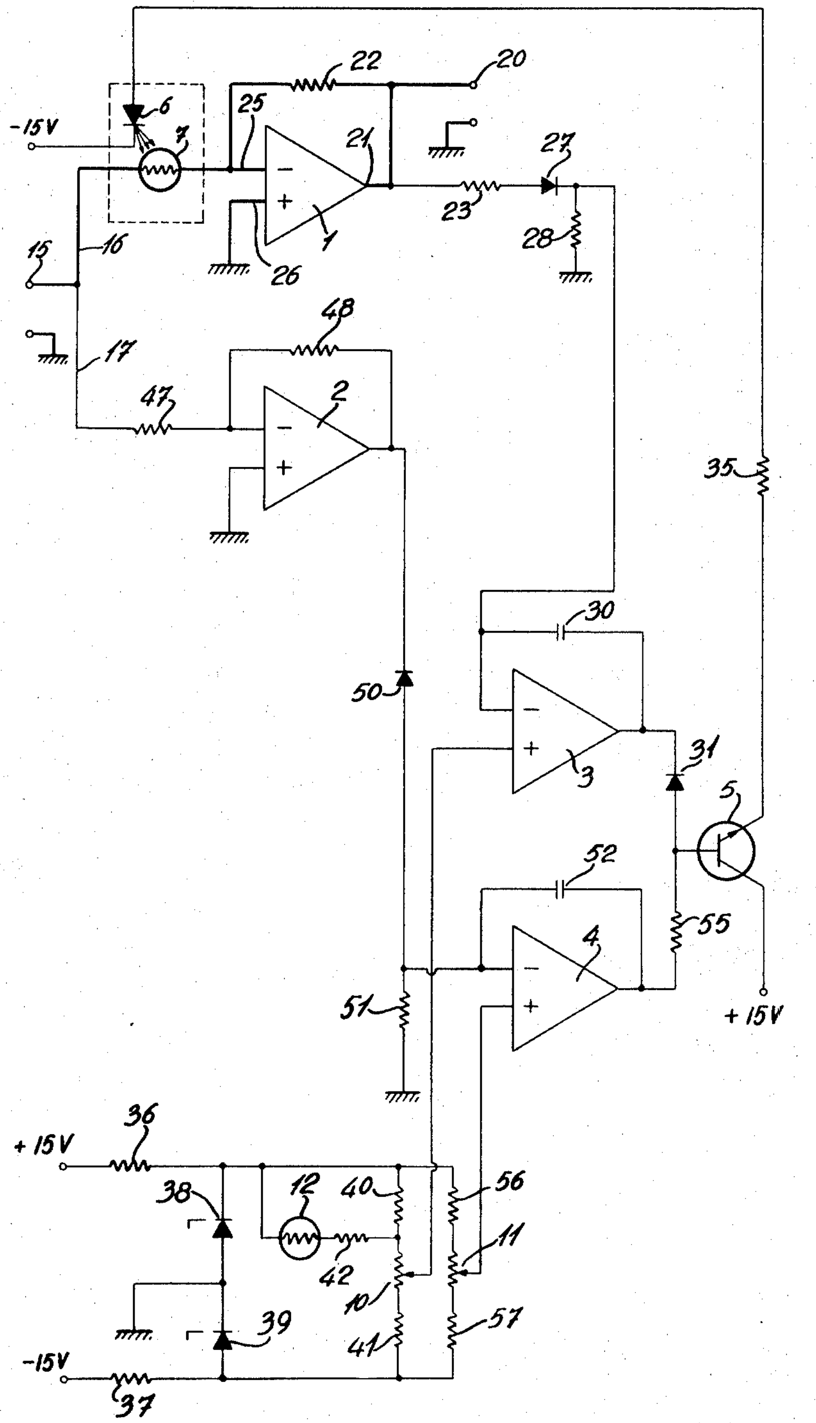
INVENTOR
Hans-Lothar George HARMGARDT
ATTORNEY

REGULATING AMPLIFIER

This invention relates to regulated amplifiers and more particularly to amplifiers for delivering coded tone pulses to an array of filters for decoding, in which a substantially constant output level is desired when there is a usable signal and in which it is desired to turn the amplifier off when there is no usable signal, even for relatively short intervals.

Multifrequency tone pulses are being used increasingly for transmission of telephone switching signals and also for a variety of data transmitting systems in which entries are made manually or by small cards. Each tone pulse usually transmits waves of two out of six predetermined frequencies. For decoding, the tone pulses are fed to a group of band-pass filters, which in turn are connected to detectors of a decoding system. For the most reliable operation of the detecting system, it is desirable to operate the filters and detectors over a rather small range of input signal amplitude and to suppress the noise between signal pulses, as well as any signal pulses of such a low level that they are vulnerable to error produced by noise arising in the transmission facilities.

Heretofore, amplifiers having a wide dynamic range of regulation, meaning that the output is relatively constant over a very great different in input signal amplitude, have used the variable resistance characteristics of balanced diode arrangements as control elements, with the balance of the circuit providing for the application of a control voltage in such a way that even when this voltage varies rapidly, it will not produce thumps and other disturbances in the signal channel. Such control elements are also suitable for supplying quieting control conditions below a desired input amplitude threshold with little or no introduction of disturbances in the output signal. These balanced diode regulation circuits involve a great deal of complication, however, since they require either a large number of components or else the use of a plurality of center-tapped transformers which are expensive and relatively bulky.

To avoid the circuit complication of balanced diode regulators, temperature sensitive resistors have been used as regulating elements in juxtaposition to a heating element driven by a control current derived from the amplifier. Such arrangements have not been suitable for rapid action, and as a result a somewhat similar combination of a gas-discharge lamp and a light sensitive resistor of cadmium sulfide or cadmium selenide has been proposed. I have found that when a light emitting diode, such as a gallium arsenide, gallium phosphide or gallium arsenide-phosphide diode, is used to control the light sensitive regulating resistor of an amplifier, the change in resistivity of the latter, with respect to change of diode current is substantially logarithmic, which means that in a proper circuit the amplification of the controlled amplifier can likewise have a logarithmic relation to the diode current over a wide range of operation. I have also found that the regulating action in such an arrangement can be as fast as could be desired for pulse rates up to at least 10 per second and that the operating characteristic of this regulation combination is suitable both for turning off the amplifier between pulses and for regulating the output volume during pulses. The light emitting diode moreover, is ideally suited for operation in response to transistor circuitry that most efficiently fits together the two functions of interpulse quieting and pulse amplitude regulation.

By this invention semiconductor circuitry if provided for the regulated amplifier and its control circuits with direct connection between all of the various semiconductor amplifiers, thus avoiding the limitations or expense, or both, of reactive couplings. By the use of standard operational amplifier microcircuit units the construction of a regulated amplifier according to this invention can be accomplished with relatively few components and great manufacturing simplicity.

In the annexed drawing is shown the circuit diagram of an illustrative embodiment of the invention.

As shown in the drawing the major components of the regulated amplifier according to this invention are four operational amplifier units 1, 2, 3 and 4, a transistor 5, a light emitting diode 6 and a light sensitive resistor 7. The light emitting diode 6 and the light sensitive resistor 7 are close-coupled and shielded from external light by means of heat shrinkable plastic tubing and mounted as a unit. Because this unit is temperature sensitive, it should be well spaced from nearby semiconductors or resistors. All of the other elements of the circuit are small capacitors and resistances except for the two small potentiometers 10 and 11 and the thermosensitive resistor 12 in the reference voltage supply. Consequently all these components can easily be mounted on a single sheet of insulating material of the usual "circuit board" type, with leads going through holes in the supporting sheet so that the wiring is one the other side (in any of the usual forms, either wire, printed metallic pattern or etched foil pattern).

The signal input is shown at 15. It supplies the input circuits of operational amplifier unit 1 and operational amplifier unit 2 through the branch connections 16 and 17 respectively. The circuit of operational amplifier unit 1 (shown in heavier lines than those of the associated control circuits) is the regulated amplifier which treats the signal in the desired way in order to supply it to the output connection 20 where a connection would be made (not shown) to the band-pass filters of a decoding detector.

Operational amplifier units 1 and 2, like operational amplifier units 3 and 4 are microcircuit semiconductor amplifying units, containing many transistors and associated circuit elements manufactured in one piece. They have an output connection and two input connections, one for use when the output signal is to be inverted with respect to the input and one in which it is to be in the same sense as the input. Inversion merely means that the positive-going portion of an input signal wave will produce a negative-going portion of an output signal wave. The inverting input is conventionally indicated by a minus sign and the noninverting input by a plus sign. In addition, the operational amplifier units have connections for positive and negative supply voltages (which have been omitted for simplicity in the drawing). Fairchild type 741 units, which have open-loop gain of about 80 db, are preferred for each of the operational amplifiers. A somewhat higher dynamic range of regulation could be obtained by using a Fairchild type 725 for a regulated amplifier unit 1, but the dynamic range of regulation is already so great with the type 741 that for manufacturing economy and convenience I prefer to use the type 741 throughout. The terminals of these units which are provided for connection to a potentiometer for offset current adjustment are not used in the present circuit, since the input a.c. signal is applied to only one of the operational amplifier inputs. These terminals are accordingly not shown in the drawing.

The output connection 21 of operational amplifier unit 1 is connected to the signal output terminal 20, to a feedback resistor 22 and to a decoupling resistor 23 which supplies a portion of the output to the regulation control circuit. The inverting input connection 25 of operational amplifier unit 1 is connected to the other end of feedback resistor 22 and also to light sensitive resistor 7, the other end of which, through the connection 16, receives the input signal. The noninverting input 26 of operational amplifier unit 1 is connected to ground. Thus both the signal input and output are with reference to the apparatus ground.

In the circuit just described, the gain between input and output will be approximately proportional to the ratio of resistance 22 to the resistance of light sensitive resistor 7. For light sensitive resistor 7, I prefer Clairex type 907 HL, a cadmium sulfide type which has a resistance of about 20 megohms when dark and only 1,000 ohms when fully illuminated. Resistor 22 preferably has a value of 75,000 ohms. Even at high illumination of diode 6, where relatively large changes in diode current are necessary to produce reduction in resistance of resistor 7 (because of the logarithmic response characteristic previously mentioned) very large changes in amplifier gain will nevertheless result because the ratio of resistance of elements 23 and 7 still changes rapidly with changes in diode current. For the light emitting diode 6, I prefer Hewlett-Packard type 5082—4405, which has an emission wavelength of 6,600 A, which fits very well with the sensitivity of the cadmium sulfide light sensitive resistor in question.

Resistor 23 serves merely to prevent any transient disturbances from being propagated backward from the control circuit to the signal output 20. It typically has a value of 1,000 ohms. Diode 27 and its discharge resistor 28 form an integrating circuit to provide to the inverting input of operational amplifier unit 3 a voltage proportional to the amplitude of the output signal of operational amplifier unit 1. The diode polarity is chosen to make this voltage positive-going with increasing amplitude, since it is desired that the output of operational amplifier unit 3 would be negative-going with increasing signal. Feedback capacitor 30 modifies the time-constant of the integration operation.

The output of operational amplifier unit 3 is connected to the base electrode of transistor 5 through diode 31, which prevents operational amplifier unit 3 from influencing transistor 5 unless its output is more negative than that of operational amplifier unit 4. Transistor 5 operates in the emitter follower mode and has a load resistor 35 connected between its emitter and light emitting diode 6 in order to limit the current through diode 6 to a suitable amount. The other side of light emitting diode 6 is connected to a negative voltage supply. The collector of transistor 5 is connected to a positive voltage supply. The supply voltages are respectively −15 volts and +15 volts, with reference to a common ground.

In order to compensate for the negative temperature coefficient of the light emitting diode, a temperature dependent voltage is provided to the noninverting input of operational amplifier unit 3. This voltage is derived from a regulation circuit utilizing dropping resistors 36 and 37 and Zener diodes 38 and 39, to provide certain reference voltages which need to be independent of any variation in the power supply voltages. Potentiometer 10, which need not exceed 1,000 ohms in resistance, is provided for determining a regulated voltage near ground potential, being connected in series with resistors 40 and 41. A branch circuit including resistor 42 and thermistor 12 is connected in parallel with resistor 40 to make the voltage applied to operational amplifier unit 3 somewhat more positive as temperature increases. For the particular diode specified above, I prefer to use a Northern Electric type 8 C for thermistor 12 and to give resistors 40 and 41 the value of 4,300 ohms, and resistor 42 the value of 82,000 ohms.

Another amplifier-integration circuit develops the threshold control of the amplifier.

Operational amplifier unit 2 operates on the unmodified input signal and its gain is determined by resistors 47 and 48, which are preferably 10,000 and 470,000 ohms respectively. Operational amplifier unit 2 serves to provide an amplified signal to the integrating network constituted by diode 50 and resistor 51, whose characteristic is modified by feedback capacitor 52 of the circuit of operational amplifier unit 4. Feedback capacitor 52 is of much lower value than capacitor 30 since a much shorter integration time factor is desired for the threshold control. Diode 50 is poled so as to provide, to the inverting input of operational amplifier unit 4, a negative-going voltage with increasing amplitude of the output signal of operational amplifier unit 2. The output of operational amplifier unit 4 will then provide an amplified positive-going voltage when a tone pulse arrives at the input of operational amplifier 2. The output of operational amplifier unit 4 is connected to the base electrode of transistor 5 through resistor 55.

Potentiometer 11 and its series resistors 56 and 57, the former having a somewhat higher value than the latter, derive a slightly negative reference voltage to be applied to the non-inverting input of operational amplifier 4. This voltage is normally adjusted so that the output will remain in its most negative condition, which is at approximately −14 volts unless alternating current energy of a power level of at least −35 dbm is present at the signal input 15, but may be varied by means of potentiometer 11 if a slightly higher or lower threshold is desired. When the input signal energy exceeds the threshold, the amplification of operational amplifiers 2 and 4 is such that the output of operational amplifier 4 very quickly reaches its most positive condition which is approximately +14 volts, except when the signal is only a very few db above threshold, in which case it will go only to some intermediate value. At the same time, the output of operational amplifier unit 3 will be down from +14 volts by an amount depending on the signal amplitude, reaching −14 volts only for very strong signals. When that output is more negative than that of amplifier unit 4, diode 31 will conduct and pull down the base voltage of transistor 5. Thus very quickly after the occurence of a signal, the light emitting diode, which has been kept dark in the absence of a signal because of the state of operational amplifier unit 4, is illuminated to a brilliance which, except in the described case of very weak signals, is determined by the output of operational amplifier unit 3.

The specific circuit shown as an illustration of the invention will operate even when the input signal is above the energy level desired for the output. When the signal reaches so high a level the illumination of the light emitting diode approaches the dark condition, increasing the resistance value of the light sensitive resistor into the multi-megohm range. The gain, determined by the ratio of resistances 22 and 7, falls below unity, which means that there is attenuation of the signal rather than amplification. There is likewise attenuation of line noise and subliminal signals when operational amplifier unit 4 keeps transistor 5 blocked and light emitting diode 6 dark for lack of a signal above the threshold value determined by the setting of potentiometer 11. On the other hand, when a signal is present but weak, over 30 db of amplification may be provided between input 15 and output 20. The following table shows the characteristics of a typical amplifier of the form described above as an illustrative embodiment of the invention.

TABLE I

| | |
|---|---|
| Input level threshold | −35 dbm |
| " " range | −35 to +10 dbm |
| " threshold adjustment | ±0 3 db |
| " impedance | 2800 ohms |
| Output level | −3 dbm |
| " adjustment range | ± 5 db |
| " impedance | 600 ohms |
| Bandwidth (flat portion) | 70 hz to 10 Khz |
| Total harmonic distortion | .5% over range |
| Temperature range | 0 to 65°C |
| Power consumption: | |
| idling | 1.5 W |
| max. (at −30 dbm input) | 2.2 W |
| Output level control | |
| accuracy over temperature range | ± .3 db |

The output connection will tolerate a short circuit to ground without damage to the amplifier. The amplification characteristic of the amplifier of Table I has a sharply rising portion just above the threshold level, where transistor 5 is under control of operational amplifier unit 4, rising 2.5 db for every db of increase of input level until control changes over to operational amplifier unit 3, which occurs typically at about −32 dbm input and about 3 dbm output levels. For higher input levels the output level remains substantially constant, subject to the slight temperature variation noted in Table I.

The regulating speed, measured with 0 dbm tone pulses repeated at the rate of 10 pulses per second, provides a 10 milli-second rise time and 15 percent overshoot. The small amount of overshoot is not enough to disturb following filters or detectors. A much faster rise time, even without more overshoot in the amplifier might produce ringing in the filters fed by the amplifier output.

I claim:

1. A controlled-gain amplifier for coded tone pulses providing output tone pulses at a closely controlled volume level, but providing no amplification between pulses, comprising:

a. a regulated semiconductor amplifier stage the gain of which is controlled by a light-sensitive series resistor in its input circuit, b. a first integrating semiconductor amplifier stage with its input directly coupled in parallel to the output of said regulated amplifier stage through a diode and discharge resistor network which, in cooperation with a feedback capacitor, causes such stage to operate as an integrating amplifier, c. a regulating semiconductor stage, with its input coupled to the output of said first integrating amplifier stage through a diode adapted to decouple said stages on the application of a blocking voltage to the input of said regulating semiconductor stage, and with its output driving a light emitting diode mounted in proximity to said light-sensitive series resistor of said regulated amplifier stage to provide regulation of the latter stage, d. a quieting amplifier-integrator circuit comprising a semiconductor amplifier stage and a second integrating amplifier stage, which circuit has its input in parallel with the input of said regulated amplifier stage and delivers a blocking voltage, responding to signal with a polarity of response opposite to that of said first integrating amplifier stage, to said regulating semiconductor stage when the input to said circuit is below a predetermined amplitude level, and e. voltage reference means for supplying an adjustable reference voltage to said second integrating amplifier stage for setting said predetermined amplitude level and for supplying a temperature-dependent reference voltage to said first integrating amplifier stage for compensating the temperature dependence of said light emitting diode.

2. An amplifier according to claim 1, in which said light-sensitive resistor is made of cadmium sulfide and in which said light emitting diode is made of a material selected from the group consisting of gallium arsenide, gallium arsenide-phosphide and gallium phosphide.

3. An amplifier according to claim 1, in which said regulated semiconductor amplifier stage has a feedback resistor the resistance of which is more than 50 times the resistance which said light-sensitive resistor has under maximum illumination by said light emitting diode and less than one twentieth of the resistance which said light-sensitive resistor has under minimum illumination by said light emitting diode.

4. A controlled-gain amplifier for coded tone pulses for providing output tone pulses at a closely controlled volume level comprising:

a. a first operational amplifier unit to which a tone pulse signal is supplied to its inverting-mode input terminal through a photosensitive resistor in series between said input and the source of said signal and which has a feedback resistor between its output terminal, to which an output circuit is connected, and said input, b. a second operational amplifier unit to the inverting-mode input of which said signal is supplied through a series resistor of fixed value and which likewise has a feedback resistor between its output terminal and its said input, c. a third operational amplifier unit having its inverting-mode input connected to the output of said first operational amplifier unit through an isolating series resistance and a diode, having a diode discharge resistor connected between said input and the apparatus ground, and having a feedback capacitor between its output connection and its said input, said diode being poled to produce a negative swing on an increase of input signal amplitude, d. a fourth operational amplifier unit having its inverting-mode input connected to the output of said second operational amplifier unit through a diode poled so as to provide a positive swing at said input on the arrival of a tone pulse at the input of said second operational amplifier unit, having a diode discharge resistor connected between its said input and the apparatus ground, and having a feedback capacitor between its output connection and its input, e. a gain control circuit comprising a transistor with its input terminal connected to the output terminal of said fourth operational amplifier unit through a resistor and to the output terminal of said third operational amplifier unit through a diode so poled that said third operational amplifier unit is decoupled from said gain control circuit except when the presence of a tone pulse causes said fourth operational amplifier unit to conduct and thereby remove a blocking voltage from said transistor, said transistor also have its output terminal connected through a series resistor to a light emitting diode adapted to emit light in approximately logarithmic relation to the transistor output current, said light emitting diode being placed so as to illuminate said light-sensitive resistor in the input circuit of said first operational amplifier unit, and f. a regulated voltage supply providing an adjustable reference voltage to the non-inverting input of said fourth operational amplifier unit for setting the turn-on threshold of the controlled-gain amplifier and providing also to the non-inverting input of said third operational amplifier unit a temperature dependent reference voltage adapted to compensate for the temperature coefficient of the light emission of said light emitting diode.

5. An amplifier according to claim 5, in which all of said operational amplifier units, exclusive of the devices described in claim 4, as connected thereto, are identical except for random manufacturing variations.

6. An amplifier according to claim 4, in which the feedback capacitor and the diode discharge resistor connected to said fourth operational amplifier unit are of such values as to provide a turn-on signal rise time of approximately 10 milliseconds with an input of 0 dbm tone pulses supplied at a rate of 10 pulses per second.

* * * * *